United States Patent
Jaiswal et al.

(10) Patent No.: US 12,320,870 B2
(45) Date of Patent: Jun. 3, 2025

(54) CONTROLLING OUT-OF-PLANE ANISOTROPY IN AN MR SENSOR WITH FREE LAYER DUSTING

(71) Applicant: Allegro MicroSystems, LLC, Manchester, NH (US)

(72) Inventors: Samridh Jaiswal, London (GB); Paolo Campiglio, Arcueil (FR)

(73) Assignee: Allegro MicroSystems, LLC, Manchester, NH (US)

( * ) Notice: Subject to any disclaimer, the term of this patent is extended or adjusted under 35 U.S.C. 154(b) by 442 days.

(21) Appl. No.: 17/813,412

(22) Filed: Jul. 19, 2022

(65) Prior Publication Data

US 2024/0027547 A1    Jan. 25, 2024

(51) Int. Cl.
| | |
|---|---|
| *H10N 50/85* | (2023.01) |
| *G01R 33/09* | (2006.01) |
| *H01F 10/32* | (2006.01) |
| *H10N 50/10* | (2023.01) |

(52) U.S. Cl.
CPC ......... *G01R 33/093* (2013.01); *G01R 33/098* (2013.01); *H01F 10/3286* (2013.01); *H10N 50/10* (2023.02); *H10N 50/85* (2023.02)

(58) Field of Classification Search
CPC .... G01R 33/093; G01R 33/098; H10N 50/85; H10N 50/10; H01F 10/3286
USPC ....................................................... 257/421
See application file for complete search history.

(56) References Cited

U.S. PATENT DOCUMENTS

| | | |
|---|---|---|
| 5,216,560 A | 6/1993 | Brug et al. |
| 5,282,104 A | 1/1994 | Coutellier et al. |
| 5,561,368 A | 10/1996 | Dovek et al. |
| 5,677,625 A | 10/1997 | Dieny |
| 5,821,517 A | 10/1998 | Fedeli et al. |
| 5,858,125 A | 1/1999 | Hasegawa |
| 5,895,727 A | 4/1999 | Hasegawa |
| 5,923,514 A | 7/1999 | Scott et al. |
| 5,933,306 A | 8/1999 | Santos et al. |
| 6,013,365 A | 1/2000 | Dieny et al. |
| 6,026,355 A | 2/2000 | Rahman et al. |
| 6,055,136 A | 4/2000 | Gill et al. |
| 6,069,476 A | 5/2000 | Vieux-Rochaz et al. |

(Continued)

FOREIGN PATENT DOCUMENTS

| | | |
|---|---|---|
| CN | 201622299 U | 11/2010 |
| CN | 101900754 A | 12/2010 |

(Continued)

OTHER PUBLICATIONS

U.S. Appl. No. 16/157,313, filed Oct. 11, 2018, Lassalle-Balier et al.

(Continued)

*Primary Examiner* — Jami Valentine Miller
(74) *Attorney, Agent, or Firm* — DALY, CROWLEY, MOFFORD & DURKEE, LLP

(57) ABSTRACT

Methods and apparatus for a magnetoresistive (MR) sensor a free layer with a thickness of the CoFeB material to produce out-of-plane sensing for the sensor and a reference layer magnetically coupled to the free layer. A dusting layer of an oxide material is disposed on the free layer to achieve perpendicular magnetic anisotropy for an interface of the oxide layer and the free layer for a desired sensitivity for the sensor.

16 Claims, 4 Drawing Sheets

(56) References Cited

U.S. PATENT DOCUMENTS

| | | | |
|---|---|---|---|
| 6,094,330 A | 7/2000 | Criniti et al. | |
| 6,141,197 A | 10/2000 | Kim et al. | |
| 6,166,539 A | 12/2000 | Dahlberg et al. | |
| 6,278,592 B1 | 8/2001 | Xue et al. | |
| 6,373,247 B1 | 4/2002 | Marx et al. | |
| 6,411,476 B1 | 6/2002 | Lin et al. | |
| 6,429,640 B1 | 8/2002 | Daughton et al. | |
| 6,462,641 B1 | 10/2002 | Dieny et al. | |
| 6,490,140 B1 | 12/2002 | Mao et al. | |
| 6,501,678 B1 | 12/2002 | Lenssen et al. | |
| 6,522,132 B1 | 2/2003 | Vieus-Rochaz et al. | |
| 6,532,164 B2 | 3/2003 | Redon et al. | |
| 6,603,677 B2 | 8/2003 | Redon et al. | |
| 6,770,382 B1 | 8/2004 | Chang et al. | |
| 7,064,937 B2 | 6/2006 | Wan et al. | |
| 7,095,596 B2 | 8/2006 | Schmollngruber et al. | |
| 7,106,046 B2 | 9/2006 | Nagano et al. | |
| 7,176,679 B2 | 2/2007 | Baragatti et al. | |
| 7,259,545 B2 | 8/2007 | Stauth et al. | |
| 7,288,931 B2 | 10/2007 | Granig et al. | |
| 7,394,247 B1 | 7/2008 | Guo et al. | |
| 7,453,672 B2 | 11/2008 | Dieny et al. | |
| 7,463,016 B2 | 12/2008 | Shoji | |
| 7,472,004 B2 | 12/2008 | Hara et al. | |
| 7,713,755 B1 | 5/2010 | Xiao | |
| 7,759,933 B2 | 7/2010 | Coillot et al. | |
| 7,799,179 B2 | 8/2010 | Maass et al. | |
| 7,813,202 B2 | 10/2010 | Rodmacq et al. | |
| 7,838,133 B2 | 11/2010 | Zhang et al. | |
| 7,855,555 B2 | 12/2010 | Biziere et al. | |
| 7,902,811 B2 | 3/2011 | Shoji | |
| 7,944,205 B2 | 5/2011 | Fermon et al. | |
| 7,944,736 B2 | 5/2011 | Dieny et al. | |
| 8,093,886 B2 | 1/2012 | Okada et al. | |
| 8,129,988 B2 | 3/2012 | Fermon et al. | |
| 8,269,491 B2 | 9/2012 | Cummings et al. | |
| 8,279,666 B2 | 10/2012 | Dieny et al. | |
| 8,422,176 B1 | 4/2013 | Leng et al. | |
| 8,487,701 B2 | 7/2013 | Boujamaa et al. | |
| 8,513,944 B2 | 8/2013 | Rodmacq et al. | |
| 8,542,072 B2 | 9/2013 | Dieny et al. | |
| 8,624,590 B2 | 1/2014 | Dieny | |
| 8,638,529 B1 | 1/2014 | Leng et al. | |
| 8,669,122 B2 | 3/2014 | Viala et al. | |
| 8,743,507 B1 | 6/2014 | Hassan et al. | |
| 8,779,764 B2 | 7/2014 | Meguro et al. | |
| 8,836,317 B2 | 9/2014 | Kasajima | |
| 8,847,589 B2 | 9/2014 | Walther et al. | |
| 9,046,562 B2 | 6/2015 | Cummings et al. | |
| 9,093,102 B1 | 7/2015 | Gong et al. | |
| 9,378,761 B1* | 6/2016 | Seagle | G11B 5/3954 |
| 9,465,056 B2 | 10/2016 | Han et al. | |
| 9,529,060 B2 | 12/2016 | Fermon et al. | |
| 9,741,372 B1 | 8/2017 | Campiglio | |
| 9,804,234 B2 | 10/2017 | Dressler et al. | |
| 9,812,637 B2 | 11/2017 | Fermon et al. | |
| 9,922,673 B2 | 3/2018 | Campiglio et al. | |
| 10,026,425 B2 | 7/2018 | Campiglio | |
| 10,060,880 B2 | 8/2018 | Chen et al. | |
| 10,347,277 B2 | 7/2019 | Campiglio et al. | |
| 10,620,279 B2 | 4/2020 | Campiglio et al. | |
| 10,727,402 B2* | 7/2020 | Ando | H01F 41/22 |
| 10,734,443 B2 | 8/2020 | Lassalle-Balier et al. | |
| 10,753,989 B2 | 8/2020 | Campiglio et al. | |
| 10,840,001 B2 | 11/2020 | Lassalle-Balier et al. | |
| 11,002,807 B2 | 5/2021 | Campiglio et al. | |
| 11,022,661 B2 | 6/2021 | Lassalle-Balier et al. | |
| 11,127,518 B2 | 9/2021 | Campiglio et al. | |
| 11,193,989 B2 | 12/2021 | Campiglio et al. | |
| 11,217,626 B2 | 1/2022 | Campiglio et al. | |
| 11,467,232 B2* | 10/2022 | Muehlenhoff | H10N 50/01 |
| 2002/0061421 A1 | 5/2002 | Dieny | |
| 2002/0158626 A1 | 10/2002 | Shay et al. | |
| 2002/0171417 A1 | 11/2002 | Schoedlbauer | |
| 2002/0191356 A1 | 12/2002 | Hasegawa et al. | |
| 2003/0002226 A1 | 1/2003 | Lin et al. | |
| 2003/0053266 A1 | 3/2003 | Dieny et al. | |
| 2003/0070497 A1 | 4/2003 | Kikuchi et al. | |
| 2003/0218840 A1 | 11/2003 | Apel et al. | |
| 2003/0226409 A1 | 12/2003 | Steele et al. | |
| 2004/0056647 A1 | 3/2004 | Stauth et al. | |
| 2004/0056654 A1 | 3/2004 | Goldfine et al. | |
| 2004/0086751 A1 | 5/2004 | Hasegawa et al. | |
| 2004/0207035 A1 | 10/2004 | Witcraft et al. | |
| 2004/0263157 A1 | 12/2004 | Sudo et al. | |
| 2005/0068683 A1 | 3/2005 | Gill | |
| 2005/0115822 A1 | 6/2005 | Maass et al. | |
| 2005/0180059 A1 | 8/2005 | Gill | |
| 2006/0002184 A1 | 1/2006 | Hong et al. | |
| 2006/0038407 A1 | 2/2006 | Shelley et al. | |
| 2006/0077598 A1 | 4/2006 | Taylor et al. | |
| 2006/0091993 A1 | 5/2006 | Shoji | |
| 2006/0114098 A1 | 6/2006 | Shoji | |
| 2006/0193089 A1 | 8/2006 | Li et al. | |
| 2006/0214656 A1 | 9/2006 | Sudo et al. | |
| 2006/0218775 A1 | 10/2006 | Carey et al. | |
| 2007/0019341 A1 | 1/2007 | Mizuno et al. | |
| 2007/0044370 A1 | 3/2007 | Shoji | |
| 2007/0076332 A1 | 4/2007 | Shoji et al. | |
| 2007/0121249 A1 | 5/2007 | Parker | |
| 2007/0164734 A1 | 7/2007 | Shimizu et al. | |
| 2008/0031035 A1 | 2/2008 | Rodmacq et al. | |
| 2008/0098167 A1 | 4/2008 | Rodmacq et al. | |
| 2008/0151615 A1 | 6/2008 | Rodmacq et al. | |
| 2008/0171223 A1 | 7/2008 | Wang et al. | |
| 2008/0258721 A1 | 10/2008 | Guo et al. | |
| 2008/0316655 A1 | 12/2008 | Shoji | |
| 2009/0015252 A1 | 1/2009 | Raberg et al. | |
| 2009/0015972 A1 | 1/2009 | Dieny et al. | |
| 2009/0021249 A1 | 1/2009 | Kumar et al. | |
| 2009/0027048 A1 | 1/2009 | Sato et al. | |
| 2009/0087589 A1 | 4/2009 | Guo et al. | |
| 2009/0115405 A1 | 5/2009 | Guo | |
| 2009/0161268 A1 | 6/2009 | Lin | |
| 2009/0189601 A1 | 7/2009 | Okada et al. | |
| 2009/0192755 A1 | 7/2009 | Sheiretov et al. | |
| 2009/0237075 A1 | 9/2009 | Koss | |
| 2009/0251829 A1 | 10/2009 | Zhang et al. | |
| 2009/0289694 A1 | 11/2009 | Rieger et al. | |
| 2009/0290053 A1 | 11/2009 | Hammerschmidt | |
| 2010/0007344 A1 | 1/2010 | Guo et al. | |
| 2010/0045277 A1 | 2/2010 | Goldfine et al. | |
| 2010/0060263 A1 | 3/2010 | Granig et al. | |
| 2010/0142101 A1 | 6/2010 | Sato et al. | |
| 2010/0277971 A1 | 11/2010 | Slaughter et al. | |
| 2011/0025320 A1 | 2/2011 | Ohta et al. | |
| 2011/0062537 A1 | 3/2011 | Oh et al. | |
| 2011/0068786 A1 | 3/2011 | Miura et al. | |
| 2011/0069413 A1 | 3/2011 | Maat et al. | |
| 2011/0133728 A1 | 6/2011 | Tokunaga | |
| 2011/0260270 A1 | 10/2011 | Zhang et al. | |
| 2012/0049843 A1* | 3/2012 | Sun | H10N 50/01 324/252 |
| 2012/0119735 A1 | 5/2012 | Zimmer et al. | |
| 2012/0156522 A1 | 6/2012 | Maat et al. | |
| 2012/0241878 A1* | 9/2012 | Hu | H10N 50/10 257/E29.323 |
| 2012/0257298 A1 | 10/2012 | Sato et al. | |
| 2012/0286382 A1 | 11/2012 | Jan et al. | |
| 2013/0094108 A1* | 4/2013 | Gao | G11B 5/3909 428/812 |
| 2013/0140658 A1 | 6/2013 | Yamane et al. | |
| 2013/0141964 A1* | 6/2013 | Yamane | H10B 61/22 365/158 |
| 2013/0270523 A1* | 10/2013 | Wang | H01F 10/3286 257/30 |
| 2013/0299345 A1 | 11/2013 | Abarra et al. | |
| 2014/0175574 A1 | 6/2014 | Watts et al. | |
| 2014/0197504 A1 | 7/2014 | Moriyama et al. | |
| 2014/0250244 A1 | 9/2014 | Song et al. | |
| 2014/0252518 A1 | 9/2014 | Zhang et al. | |
| 2014/0334032 A1 | 11/2014 | Nishioka et al. | |
| 2014/0340791 A1 | 11/2014 | Braganca et al. | |
| 2015/0022196 A1 | 1/2015 | Hebiguchi et al. | |

(56) References Cited

U.S. PATENT DOCUMENTS

| | | |
|---|---|---|
| 2015/0177286 A1 | 6/2015 | Fuji et al. |
| 2015/0192648 A1 | 7/2015 | Campiglio et al. |
| 2015/0221326 A1 | 8/2015 | Jung et al. |
| 2015/0333254 A1 | 11/2015 | Liu et al. |
| 2015/0340601 A1 | 11/2015 | Huai et al. |
| 2016/0005954 A1 | 1/2016 | Erickson et al. |
| 2016/0218277 A1 | 7/2016 | Yano et al. |
| 2016/0282101 A1 | 9/2016 | Kaji et al. |
| 2016/0359103 A1 | 12/2016 | Fermon et al. |
| 2017/0148977 A1 | 5/2017 | Zhu et al. |
| 2017/0154643 A1 | 6/2017 | Nishioka et al. |
| 2017/0256703 A1* | 9/2017 | Zhu ................. G11C 11/161 |
| 2017/0314969 A1 | 11/2017 | Ausserlechner et al. |
| 2017/0373246 A1* | 12/2017 | Wang ................. H10N 50/10 |
| 2019/0043547 A1* | 2/2019 | DeBrosse .......... G11C 11/1675 |
| 2019/0067561 A1 | 2/2019 | Avci et al. |
| 2019/0173003 A1* | 6/2019 | Beach .................. H10B 61/00 |
| 2019/0178954 A1 | 6/2019 | Lassalle-Balier et al. |
| 2019/0219616 A1 | 7/2019 | Cadugan et al. |
| 2019/0219643 A1 | 7/2019 | Cadugan et al. |
| 2019/0295615 A1* | 9/2019 | Fukuzawa .............. B82Y 25/00 |
| 2020/0033424 A1 | 1/2020 | Campiglio et al. |
| 2020/0064413 A1 | 2/2020 | Campiglio et al. |
| 2020/0106003 A1* | 4/2020 | Gottwald ............. H10N 50/10 |
| 2021/0035633 A1 | 2/2021 | Chiang et al. |
| 2021/0293911 A1 | 9/2021 | Lassalle-Balier et al. |
| 2021/0383953 A1 | 12/2021 | Campiglio et al. |
| 2021/0389393 A1 | 12/2021 | Lassalle-Balier et al. |
| 2023/0178131 A1* | 6/2023 | Carpenter ............ H10N 50/10 257/421 |
| 2023/0240150 A1* | 7/2023 | Chen ................ H01F 10/3286 |
| 2023/0263074 A1* | 8/2023 | Song ................. H10N 50/10 257/421 |
| 2024/0027547 A1* | 1/2024 | Jaiswal ............... H10N 50/85 |

FOREIGN PATENT DOCUMENTS

| | | |
|---|---|---|
| DE | 198 10 838 A1 | 9/1999 |
| DE | 198 43 348 A1 | 3/2000 |
| DE | 102 22 467 A1 | 12/2003 |
| DE | 102 57 253 A1 | 2/2004 |
| DE | 10 2005 024 879 A1 | 12/2006 |
| DE | 10 2005 042 307 A1 | 3/2007 |
| DE | 10 2006 019 483 A1 | 10/2007 |
| DE | 10 2008 030 334 A1 | 1/2010 |
| EP | 0 779 632 A1 | 6/1997 |
| EP | 0 863 406 A2 | 9/1998 |
| EP | 1 323 856 A1 | 7/2003 |
| EP | 1 336 985 A1 | 8/2003 |
| EP | 1 510 787 A2 | 3/2005 |
| EP | 1 617 472 A1 | 1/2006 |
| EP | 1 666 894 A1 | 6/2006 |
| EP | 1 672 321 A1 | 6/2006 |
| EP | 1 777 440 A2 | 4/2007 |
| EP | 1 918 678 A2 | 5/2008 |
| EP | 1 947 469 A1 | 7/2008 |
| FR | 2 727 778 A1 | 6/1996 |
| FR | 2 729 790 A1 | 7/1996 |
| FR | 2 752 302 A1 | 2/1998 |
| FR | 2 773 395 A1 | 7/1999 |
| FR | 2 774 774 A1 | 8/1999 |
| FR | 2 814 592 A1 | 3/2002 |
| FR | 2 817 998 A1 | 6/2002 |
| FR | 2 817 999 A1 | 6/2002 |
| FR | 2 830 621 A1 | 4/2003 |
| FR | 2 876 800 A1 | 4/2006 |
| FR | 2 889 348 A1 | 2/2007 |
| FR | 2 932 315 A1 | 12/2009 |
| JP | 2000-055997 A | 2/2000 |
| JP | 2000-055999 A | 2/2000 |
| JP | 2000-056000 A | 2/2000 |
| JP | 2001-230471 A | 8/2001 |
| JP | 2002-082136 A | 3/2002 |
| JP | 2002-267692 A | 9/2002 |
| JP | 2002-328140 A | 11/2002 |
| JP | 2002-542617 A | 12/2002 |
| JP | 2003-315091 A | 11/2003 |
| JP | 2005-018908 A | 1/2005 |
| JP | 2006-179566 A | 7/2006 |
| JP | 2006-214910 A | 8/2006 |
| JP | 2007-101253 A | 4/2007 |
| JP | 2007-108069 A | 4/2007 |
| JP | 2009-014544 A | 1/2009 |
| JP | 2009-252342 A | 10/2009 |
| JP | 2018-037613 A | 3/2018 |
| TW | I 513993 B | 12/2015 |
| TW | I 6333321 B | 8/2018 |
| WO | WO 2001/067085 A1 | 9/2001 |
| WO | WO 2002/084680 A1 | 10/2002 |
| WO | WO 2003/032338 A1 | 4/2003 |
| WO | WO 2003/104829 A1 | 12/2003 |
| WO | WO 2003/107018 A1 | 12/2003 |
| WO | WO 2004/048986 A2 | 6/2004 |
| WO | WO 2004/068152 A1 | 8/2004 |
| WO | WO 2004/068158 A1 | 8/2004 |
| WO | WO 2005/028993 A1 | 3/2005 |
| WO | WO 2006/136577 A1 | 12/2006 |
| WO | WO 2007/095971 A1 | 8/2007 |
| WO | WO 2007/148028 A2 | 12/2007 |
| WO | WO 2007/148029 A1 | 12/2007 |
| WO | WO 2008/012309 A2 | 1/2008 |
| WO | WO 2008/015354 A2 | 2/2008 |
| WO | WO 2009/001160 A1 | 12/2008 |
| WO | WO 2009/001162 A2 | 12/2008 |
| WO | WO 2009/007324 A1 | 1/2009 |
| WO | WO 2009/110892 A1 | 9/2009 |
| WO | WO 2010/001077 A2 | 1/2010 |
| WO | WO 2010/026948 A1 | 3/2010 |
| WO | WO 2010/066976 A1 | 6/2010 |
| WO | WO 2010/084165 A1 | 7/2010 |
| WO | WO 2010/113820 A1 | 10/2010 |
| WO | WO 2010/116102 A1 | 10/2010 |
| WO | WO 2011/007767 A1 | 1/2011 |
| WO | WO 2010/136527 A1 | 12/2012 |
| WO | WO 2018/012953 A1 | 1/2018 |

OTHER PUBLICATIONS

U.S. Appl. No. 16/157,317, filed Oct. 11, 208, Lassalle-Balier et al.
Allegro MicroSystems, LLC, "High Sensitivity, 1 MHz GMR-Based Current Sensor IC in Space-Saving Low Resistance QFN Package;" ACS70331; Dec. 1, 2017; 22 Pages.
Lee et al.; "Critical Thickness Effects of NiFeCr—CoFe Seed Layers for Spin Valve Multilayers;" IEEE Transactions on Magnetics, vol. 40, No. 4; Jul. 20024; pp. 2209-2211; 3 Pages.
Repetski et al.; "Improved Interfaces and Magnetic Properties in Spin Valves Using $Ni_{80}Fe_{20}$ Seed Layer;" Journal of Applied Physics, vol. 91, No. 6; Mar. 15, 2002; pp. 3891-3895; 5 Pages.
Sankaranarayanan et al.; "Exchange Bias Variations of the Seed and Top NiFe Layers in NiFe/FeMn/NiFe Trilayer as a Function of Seed Layer Thickness;" Journal of Magnetism and Magnetic Material 286; Feb. 2005; pp. 196-199; 4 Pages.
Notice of Allowance dated Aug. 22, 2019 for U.S. Appl. No. 15/869,620; 11 Pages.
Taiwan $1_{st}$ Office Action (with English Translation) dated May 28, 2020 for Taiwan Application No. 108127885; 20 Pages.
PCT International Search Report and Written Opinion of the ISA dated Jun. 3, 2015; for PCT Pat. App. No. PCT/US2015/010424; 17 Pages.
Response to PCT Written Opinion dated Feb. 27, 2017 for EP Pat. Appl. No. 15700938.2; 4 Pages.
Amended Claims included with A.A. Thornton response dated Feb. 27, 2017 for EP Pat. Appl. No. 15700938.2; 6 Pages.
U.S. Preliminary Amendment filed on Oct. 19, 2018 for U.S. Appl. No. 16/113,321; 7 Pages.
U.S. Non-Final Office Action dated Feb. 7, 2020 for U.S. Appl. No. 16/113,321; 16 Pages.
Response to U.S. Non-Final Office Action dated Feb. 7, 2020 for U.S. Appl. No. 16/113,321; Response filed Apr. 10, 2020; 12 Pages.

(56) References Cited

OTHER PUBLICATIONS

U.S. Notice of Allowance dated May 14, 2020 for U.S. Appl. No. 16/113,321; 15 Pages.
U.S. Preliminary Amendment filed on Nov. 1, 2019 for U.S. Appl. No. 16/507,538; 12 Pages.
U.S. Second Preliminary Amendment filed on Nov. 4, 2019 for U.S. Appl. No. 16/507,538; 12 Pages.
U.S. Notice of Allowance dated May 4, 2020 for U.S. Appl. No. 16/507,538; 10 Pages.
Response (with Machine English Translation) to Taiwan Office Action dated May 28, 2020 for Taiwan Application No. 108127885; Response filed Aug. 18, 2020; 19 Pages.
Taiwan Allowance Decision (with English Translation) dated Oct. 29, 2020 for Taiwan Application No. 108127885; 3 Pages.
Extended European Search Report (EESR) dated Feb. 23, 2021 for European Application No. 20184390.1; 9 Pages.
Taiwan Office Action (with English Translation) dated Dec. 1, 2021 for Taiwan Application No. 110101393; 9 Pages.
Response (with Machine English Translation) to Taiwan Office Action dated Dec. 1, 2021 for Taiwan Application No. 110101393; Response filed Feb. 9, 2022; 38 Pages.
Taiwan Allowance Decision (with English Translation) dated May 2, 2022 for Taiwan Application No. 110101393; 3 Pages.
U.S. Non-Final Office Action dated Jan. 12, 2017 for U.S. Appl. No. 14/591,213; 7 Pages.
Response to U.S. Non-Final Office Action dated Jan. 12, 2017 for U.S. Appl. No. 14/591,213; Response filed Apr. 4, 2017; 16 Pages.
U.S. Notice of Allowance dated Jul. 19, 2017 for U.S. Appl. No. 14/591,213; 6 Pages.
PCT International Preliminary Report dated Jul. 21, 2016 for International Application No. PCT/US2015/010424; 11 Pages.
European Decision to Grant dated Sep. 17, 2020 for European Application No. 15700938.2; 2 Pages.
Japanese Notice of Reasons for Rejection (with English Translation) dated Nov. 13, 2018 for Japanese Application No. 2016-545864; 13 Pages.
Response (with Machine English Translation) to Japanese Notice of Reasons for Rejection dated Nov. 13, 2018 for Japanese Application No. 2016-545864; Response filed Jan. 28, 2019; 20 Pages.
Japanese Allowance Report (with Claims and English Translation) dated Mar. 26, 2019 for Japanese Application No. 2016-545864; 10 Pages.
Korean $1^{st}$ Office Action (with English Translation) dated Nov. 23, 2020 for Korean Application No. 10-2016-7021480; 25 Pages.
Response (with English Translation) to Korean 1st Office Action dated Nov. 23, 2020 for Korean Application No. 10-2016-7021480; Response filed Jan. 21, 2021; 137 Pages.
Korean $2^{nd}$ Office Action (with English Translation) dated May 28, 2021 for Korean Application No. 10-2016-7021480; 34 Pages.
Response (with English Translation) to Korean $2^{nd}$ Office Action dated May 28, 2021 for Korean Application No. 10-2016-7021480; Response filed Jul. 27, 2021; 77 Pages.
Korean Notice of Allowance (with English Translation) dated Nov. 26, 2021 for Korean Application No. 10-2016-7021480; 10 Pages.
Response to European Examination Report Mar. 13, 2024, filed on May 22, 2024 for European Application No. 20184390.1, 20 pages.
U.S. Appl. No. 17/805,054, filed Jun. 2, 2022, Campiglio et al.
European Examination Report Mar. 13, 2024 for European Application No. 20184390.1, 7 pages.
U.S. Non-Final Office Action dated Mar. 30, 2023 for U.S. Appl. No. 17/805,054; 25 Pages.
Response to U.S. Non-Final Office Action dated Mar. 30, 2023 for U.S. Appl. No. 17/805,054; Response filed Apr. 5, 2023; 8 Pages.
U.S. Notice of Allowance dated May 10, 2023 for U.S. Appl. No. 17/805,054; 8 Pages.

* cited by examiner

CONTROLLING OUT-OF-PLANE ANISOTROPY IN AN MR SENSOR WITH FREE LAYER DUSTING

BACKGROUND

Magnetic field sensors are used in a variety of applications, including, but not limited to, angle sensing to senses an angle of a direction of a magnetic field, current sensing to sense a magnetic field generated by a current carried by a current-carrying conductor, magnetic switching to sense the proximity of a ferromagnetic object, a detecting rotation to sense passing ferromagnetic articles, for example, magnetic domains of a ring magnet or a ferromagnetic target (e.g., gear teeth) where the magnetic field sensor is used in combination with a back-biased or other magnet, and magnetic field sensing to sense a magnetic field density of a magnetic field.

In certain applications, magnetic field sensors include magnetoresistance elements which have an electrical resistance that changes in the presence of an external magnetic field. Tunnel magnetoresistance (TMR) is a magnetoresistive effect that occurs in a magnetic tunnel junction (MIT) that includes two ferromagnetic layers separated by an insulator. Electrons tunnel from one ferromagnetic layer into the other due to a quantum mechanical effects. Spin valves are a type of magnetoresistance element formed from two or more magnetic materials or layers. The simplest form of a spin valve has a reference (or magnetically fixed) layer and a free layer between which an insulative barrier is located. The resistance of the spin valve changes as a function of the magnetic alignment of the reference and free layers. Typically, the magnetic alignment of the reference layer does not change, while the magnetic alignment of the free layer moves in response to external magnetic fields.

SUMMARY

Example embodiments of the disclosure provide methods and apparatus for a magnetic field sensor including a stackup for a magnetoresistive element with a selected magnetic orientation having a defined anisotropy of the magnetic free layer for out-of-plane sensing. In embodiments, the stackup is manipulated to obtain a preferred magnetic orientation with a defined anisotropy of the magnetic free layer.

In some embodiments, the magnetic anisotropy in the free layer is tuned by changing the thickness of the active free layer component, e.g., CoFeB. By tuning the thickness of the CoFeB layer, the orientation of the free layer magnetization changes. For example, hard axis loops shift to easy axis upon increasing the CoFeB thickness. This thickness manipulation exploits the interfacial nature of perpendicular anisotropy.

In embodiments, an oxide, e.g., MgO, $Al_2O_3$ or another textured metallic oxide, dusting layer on the free layer allows for gradual control of the magnetic anisotropy of the stack. By adjusting the amount of MgO, the anisotropy can be manipulated to control the out-of-plane sensitivity of the magnetic sensor. The benefits of controlling the magnetic orientation and sensitivity in the free layer will be readily understood by one of ordinary skill in the art.

In one aspect, a method comprises: forming, as part of a magnetic sensor, a free layer, wherein the free layer comprises CoFeB material; selecting a thickness of the CoFeB material to produce out-of-plane sensing for the sensor; and controlling a thickness of a dusting layer of an oxide material on the free layer to achieve perpendicular magnetic anisotropy for an interface of the oxide material and the CoFeB for providing a desired sensitivity for the sensor.

A method can further include one or more of following features: the oxide layer comprises MgO, the thickness of the CoFeB material determines an orientation of a magnetic field of the free layer, the perpendicular magnetic anisotropy occurs as a result of hybridization between 2p and 3d orbitals of Oxygen in the oxide layer and Fe in the CoFeB, a magnetic field orientation of the free layer is orthogonal to magnetic field orientations of a reference layer, the CoFeB material has a thickness of less than 1.4 nm, the CoFeB material has a thickness of about 1.0 nm, a response of the magnetic sensor is linear, and/or the magnetic sensor comprises an angle sensor.

In another aspect, a magnetic field sensor comprises: a free layer comprising CoFeB material having a thickness to produce out-of-plane sensing for the sensor; and a dusting layer comprising an oxide material on the free layer to achieve perpendicular magnetic anisotropy for an interface of the oxide material and the CoFeB of the free layer for providing a desired sensitivity for the sensor.

A sensor can further include one or more of following features: the oxide layer comprises MgO, the thickness of the CoFeB material determines an orientation of a magnetic field of the free layer, the perpendicular magnetic anisotropy occurs as a result of hybridization between 2p and 3d orbitals of Oxygen in the oxide layer and Fe in the CoFeB, a magnetic field orientation of the free layer is orthogonal to magnetic field orientations of a reference layer, the CoFeB material has a thickness of less than 1.4 nm, the CoFeB material has a thickness of about 1.0 nm, a response of the magnetic sensor is linear, and/or the magnetic sensor comprises an angle sensor.

BRIEF DESCRIPTION OF THE DRAWINGS

The foregoing features of this invention, as well as the invention itself, may be more fully understood from the following description of the drawings in which.

DETAILED DESCRIPTION

Embodiments of the disclosure provide methods and apparatus for a magnetic sensor, such as a three-dimensional sensor, having a dusting layer on the free layer for influencing the interfacial magnetic anisotropy. Perpendicular Magnetic Anisotropy (PMA) at the interface occurs as a result of the hybridization between the 2p and 3d atomic orbitals of Oxygen in MgO, for example, and Fe in CoFeB, for example, respectively. This orbital overlap is used to finely tune the anisotropy of the free layer for enhanced sensitivity characteristics.

Figure 1A:
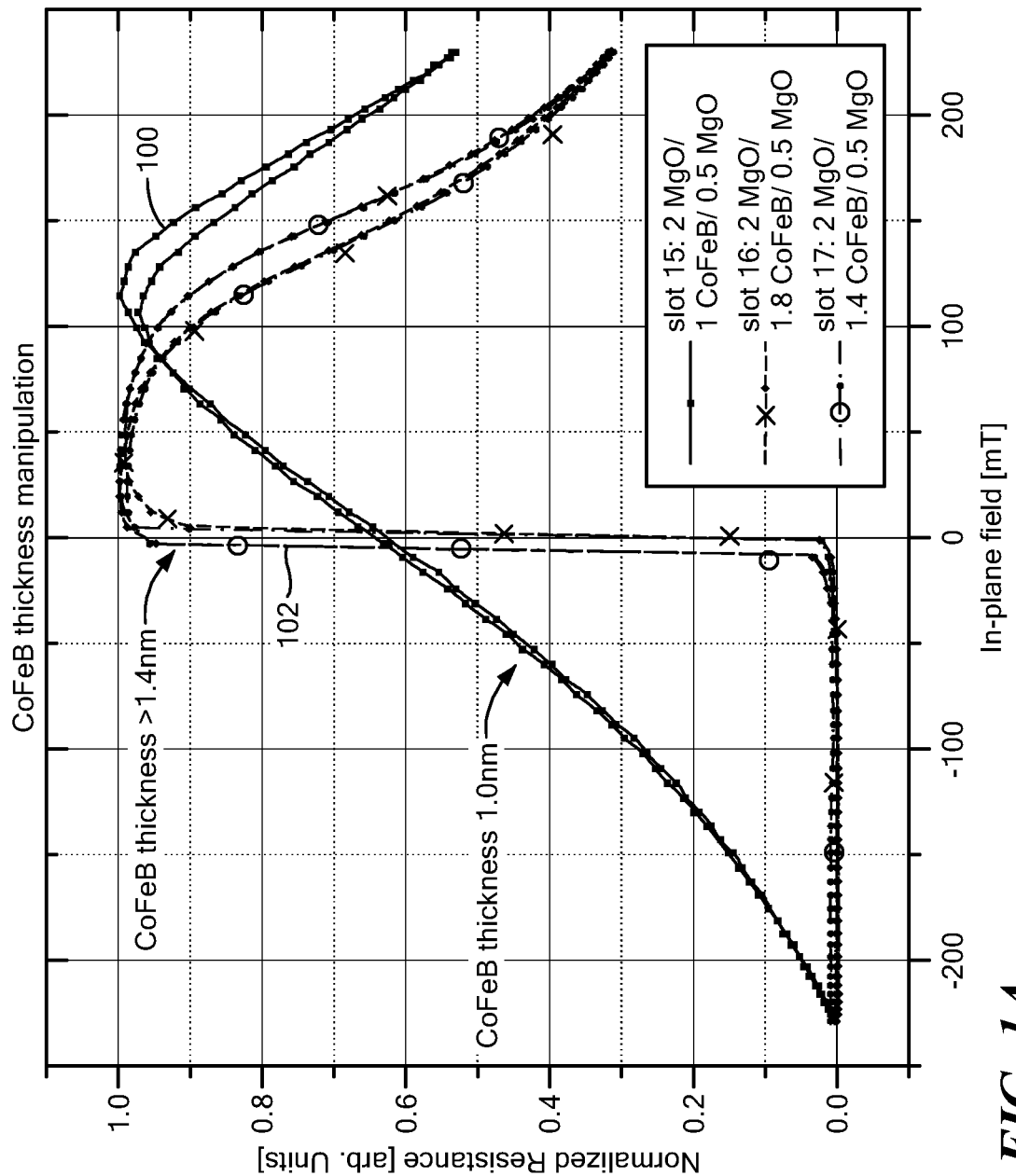
FIG. 1A is a graphical representation of resistance versus in-plane magnetic field strength for various free layer, e.g., CoFeB, thicknesses.
Figure 2:
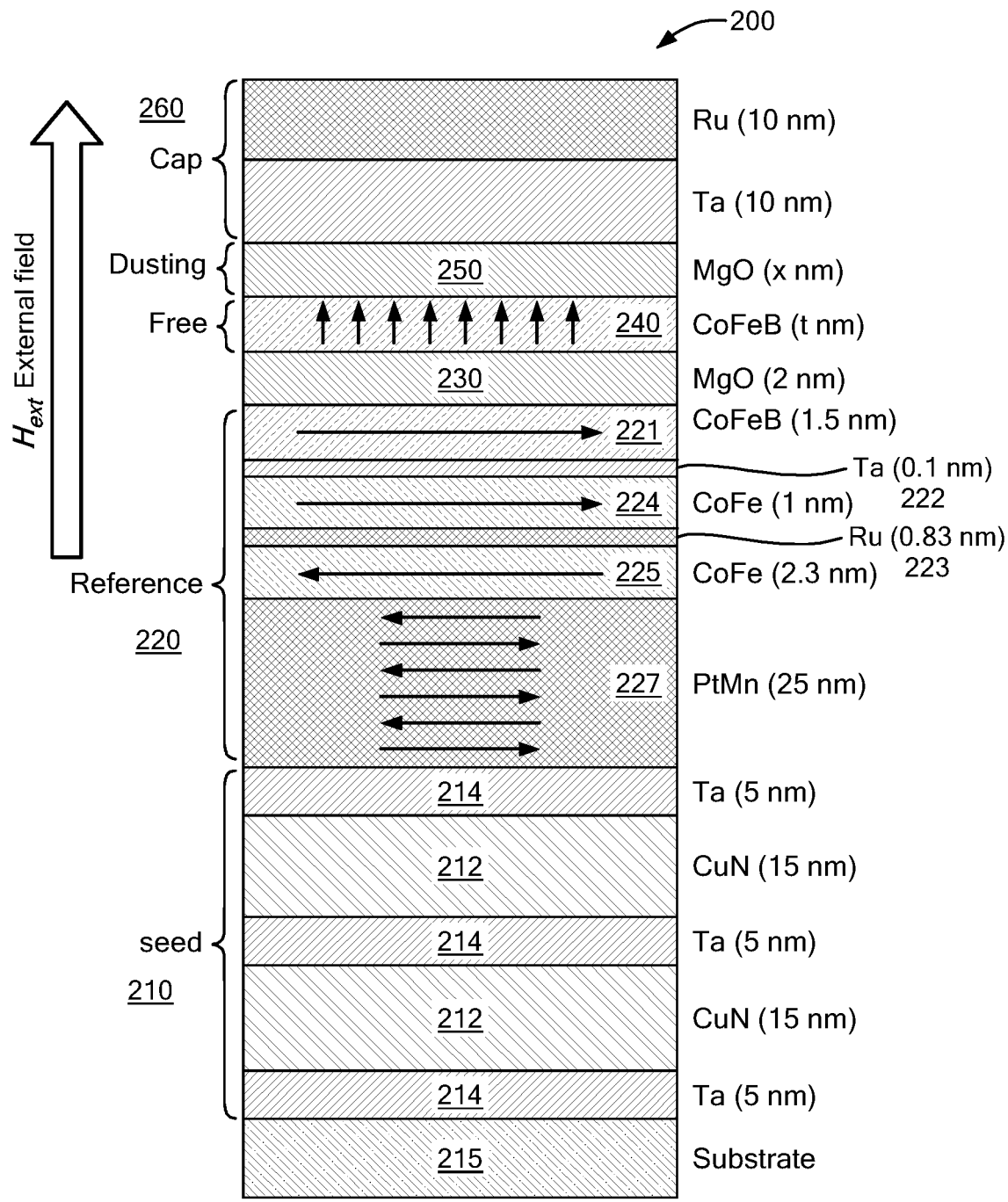
FIG. 2 shows an example layer stackup for a magnetoresistive element of a MR sensor in accordance with example embodiments of the disclosure.

FIG. 1A shows example wafer-level current-in-plane (CIPT) transport curves providing a swift transition from out-of-plane 100 free layer orientation to in plane 102 with increasing CoFeB thickness t, where curves are shown for about t=1.0 nm and t>1.4 nm. While CoFeB layers vary in the illustrated embodiment, a first MgO layer is constant at 2 nm and a second MgO layer is constant at 0.5 nm, where the CoFeB layer is between the first and second MgO layers, as shown in FIG. 2. As can be seen, for free layer CoFeB thickness of about 1.0 nm, the change in resistance for the MR element is generally linear in response to a changing external in-plane magnetic field while a free layer CoFeB thickness of more than about 1.4 nm results in a steep transition in resistance based on the in-plane field.

Figure 1B:
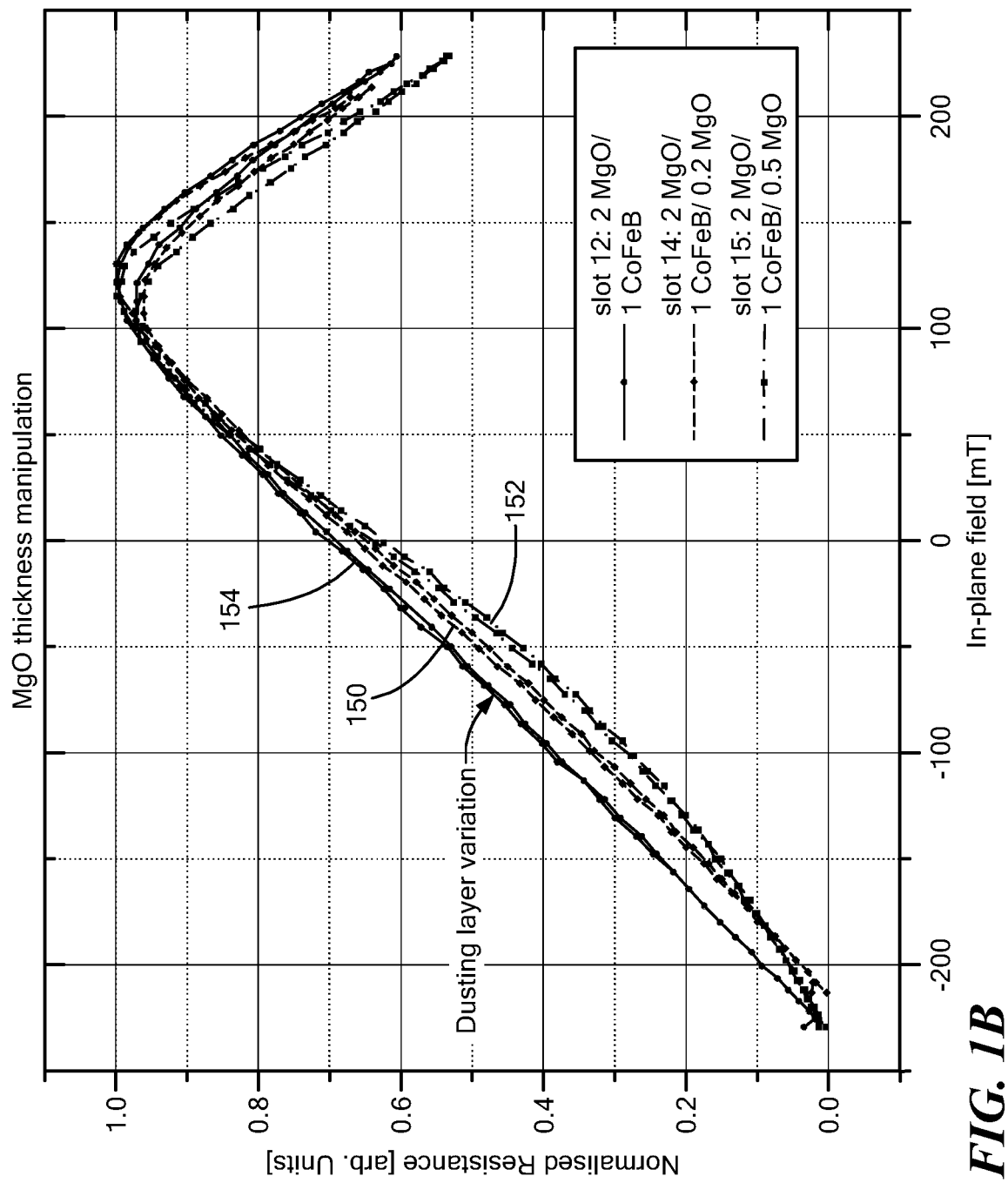
FIG. 1B is a graphical representation of resistance versus in-plane magnetic field strength for various dusting layer, e.g., MgO, thicknesses.

FIG. 1B shows example wafer level CIPT transport curves showing gradual changes in sensitivity due to modulation of anisotropy by addition of MgO dusting layer(s)s. As can be seen, utilizing an MgO dusting layer allows for gradual control of the magnetic anisotropy of the stack. By adjusting the amount of MgO, the anisotropy can be manipulated to control the out-of-plane sensitivity of the magnetic sensor. The benefits of controlling the magnetic orientation and sensitivity in the free layer will be readily understood by one of ordinary skill in the art.

In example embodiments, the dusting layer thickness of MgO can range from about 0.2 nm 150 to about 0.5 nm 152. A plot 154 is also shown for 0 nm of MgO (no MgO dusting layer) so that MgO thickness is shown for samples of 0 nm, 0.2 nm, and 0.5 nm. Out of plane anisotropy is an interfacial effect and hence even small changes to the MgO dusting layer can induce a change in the transfer curve and sensitivity of the magnetic sensor. Depending on the choice of sensitivity and linearity desired, the amount of dusting layer can be adjusted accordingly. Similar modification can be obtained by changing the CoFeB thickness, but controlling the top interface provides a more reliable way to fine tune the response.

In general, any suitable crystalline or textured oxide material can be used for a dusting layer. Naturally occurring oxide is not suitable as it is usually amorphous in nature. At the atomic level one needs to ensure a sufficient orbital overlap between oxygen and iron 2p and 3d atomic orbitals respectively.

FIG. 2 shows an example stackup for a magnetoresistive (MR) element 200 having controlled anisotropy in accordance with example embodiments of the disclosure. It is understood that out of plane and inplane orientations of the free layer are in reference to the plane of the substrate.

In the illustrative embodiment, a seed layer 210 may be provided on a substrate 215. In embodiments, the seed layer 210 does not interact with the stack magnetically, but rather, provides an electrical contact to the MR elements.

In the illustrated embodiment, a reference layer 220 is disposed on the seed layer 210. A dielectric or spacer layer 230, such as an oxide layer, e.g., MgO, is located between the reference layer 220 and a free layer 240.

In example embodiments, a dusting layer 250 is disposed on the free layer 240. A cap 260, which may comprise Ta and Ru, for example, can be disposed on the dusting layer 250 to facilitate electrical connection to the MR stackup and protect the multilayer from environmental atmosphere.

In example embodiments, the free layer 240 comprises CoFeB disposed between the dielectric layer 230 and the dusting layer 250. It is understood that the illustrated MR element 200 in FIG. 2 corresponds to certain curves in FIGS. 1A and 1B. For example, out-of-plane curves 100 in FIGS. 1A and 1B for a configuration of 2 nm MgO/1 nm CoFeB/ 0.5 MgO corresponds to dielectric layer 230 (MgO 2 nm), free layer 240 (CoFeB t nm), and dusting layer 250 (x nm) in FIG. 2, where t refers to a thickness of CoFeB and x refers to a thickness of MgO.

The magnetic alignment of the reference layer 220 is fixed and the magnetic alignment of the free layer 240 moves in response to an external magnetic field. Movement can be referenced to parallel and anti-parallel positions. The resistance of the TMR spin valve changes as a function of the magnetic alignment of the reference and free layers.

The illustrative stackup indicates the orientation of magnetic fields in the various layers. An X indicates a field pointing into the page and a circle with a dot indicates a field coming out of the page. Arrows up, down, left and right indicate fields pointing in the respective directions.

Each of the material layers in the stack has electrical and magnetic properties which, when placed together, cause magnetoresistance element 200 to react to external magnetic fields. Magnetoresistance element 200 is supported by a substrate 215 that supports integrated circuits.

In embodiments, the magnetoresistance element 200 is a spin valve device so that the electrical resistance of magnetoresistance element changes as the magnetic alignment between different material layers changes. Spin valves have at least the reference layer 220, which has a fixed magnetic alignment, and the free layer 240, which has a magnetic alignment that changes in response to an external magnetic field. When the magnetic alignment of the free layer 240 is aligned with the magnetic alignment of the reference layer 220, the electrical resistance of the spin valve has a minimal value. Conversely, when the magnetic alignment of the free layer 240 is aligned in an opposite direction to the reference layer, the electrical resistance of the spin valve is at a maximum value. At points in between, the resistance of the magnetoresistance element 200 is at an intermediate value. Generally, as the magnetic alignment of the free layer 240 changes from one extreme (e.g., oppositely aligned with the reference layer) to the other extreme (e.g., aligned with the reference layer), with selected layer configurations and thicknesses the electrical resistance of the spin valve changes linearly from its maximum value to its small value.

In the illustrated embodiment, the magnetoresistance element 200 is a perpendicular tunneling magnetoresistance (TMR) element where the magnetic alignment of free layer 240 is generally perpendicular to the substrate 215 and can spin from a direction opposite to the substrate to a direction toward the substrate. The reference layer 220 has a magnetic alignment parallel to the substrate. The free layer 240 can spins so its magnetic alignment changes in relation to the substrate which changes the resistance of the magnetoresistance element 200.

In embodiments, the dielectric or spacer layer 230 comprises an insulative material through which electrical current tunnels through the layer 230. When the magnetic directions of the free layer 240 and the reference layer 220 are aligned, more electrons can tunnel through the dielectric layer 230, which lowers the resistance of the element 200. Conversely, when the magnetic directions of free layer 240 and reference layer 220 are in opposite directions, electrons face a greater resistance to tunneling through the dielectric layer 230, and thus the electrical resistance of magnetoresistance element 200 increases.

In the illustrated embodiment, the reference layer 220 includes a CoFeB layer 221 about 1.5 nm thick and a Ta layer 222 about 0.1 nm thick. The reference layer 220 can further include an Ru layer 223 about 0.83 nm thick between a first layer 224 of CoFe about 1.0 nm thick and a second layer 225 of CoFe about 2.3 nm thick. As can be seen, the first and second CoFe layers 224, 225 have magnetic fields pointing in opposite directions as indicated by the arrows pointing to the left and right sides of the page respectively. The reference layer 220 also includes a PtMn layer 227 about 25 nm thick with a series of fields pointing in alternating directions to the left and right sides of the page. As can be seen, the reference layer 220 and the free layer 240 fields point in orthogonal directions.

In example embodiments, the seed layer 210 comprises alternating layers of CuN 212 and Ta 214, which may provide electrical contacts to a substrate. It is understood that any practical number of alternating layers of CuN 202 and Ta 204 can be used including a single Cu layer in the seed layer.

As described above, the dusting layer 250 thickness on the free layer 240 modulates the interfacial anisotropy for controlling the out-of-plane sensitivity of the magnetic sensor. For example, the slope of the response of the magnetoresistance element 200 and/or the linearity of the response can correspond to the thickness of the dusting layer. With this arrangement, out-of-plane sensing characteristics of an MR sensor can be enhanced as compared to sensors not having an oxide dusting layer on the free layer.

In other embodiments, an optional bias layer may be provided that is magnetically coupled to the free layer 240 to provide a double pinned configuration. The optional bias layer can be added above the free layer with a biasing direction in the out of plane orientation to provide an out of plane orientation of the free layer.

If no external magnetic field is present, the bias layer may cause the magnetic alignment of the free layer 240 to default to a predetermined alignment. The magnetic coupling between the bias layer and the free layer 240 is relatively weak so that an external field can override the bias and realign the magnetic alignment of the free layer. The bias layer can provide a so-called double pinned configuration since the bias layer and the reference layer 220 pin the free layer. The bias layer can help to linearize the response of the free layer 240, and therefore the resistance, to an external field.

It is understood that example dimensions are provided for the various layers in the stackup to facilitate an understanding of the disclosure and are not intended to limit the scope of the claimed invention in any way. It is understood that dimensions of the layers can be modified to meet the needs of a particular application. In addition, it is further understood that example materials are provided for which substitutions may be made to meet the needs of a particular application.

It is understood that TMR sensors can be used in a wide range of applications in which it is desirable to sense a magnetic field.

Examples of MR sensors having double pinned arrangements can be found, for example, in U.S. Pat. Nos. 9,529,060, and 9,922,673, and 9,804,234, all of which are incorporated by reference herein in their entirety.

Figure 3:
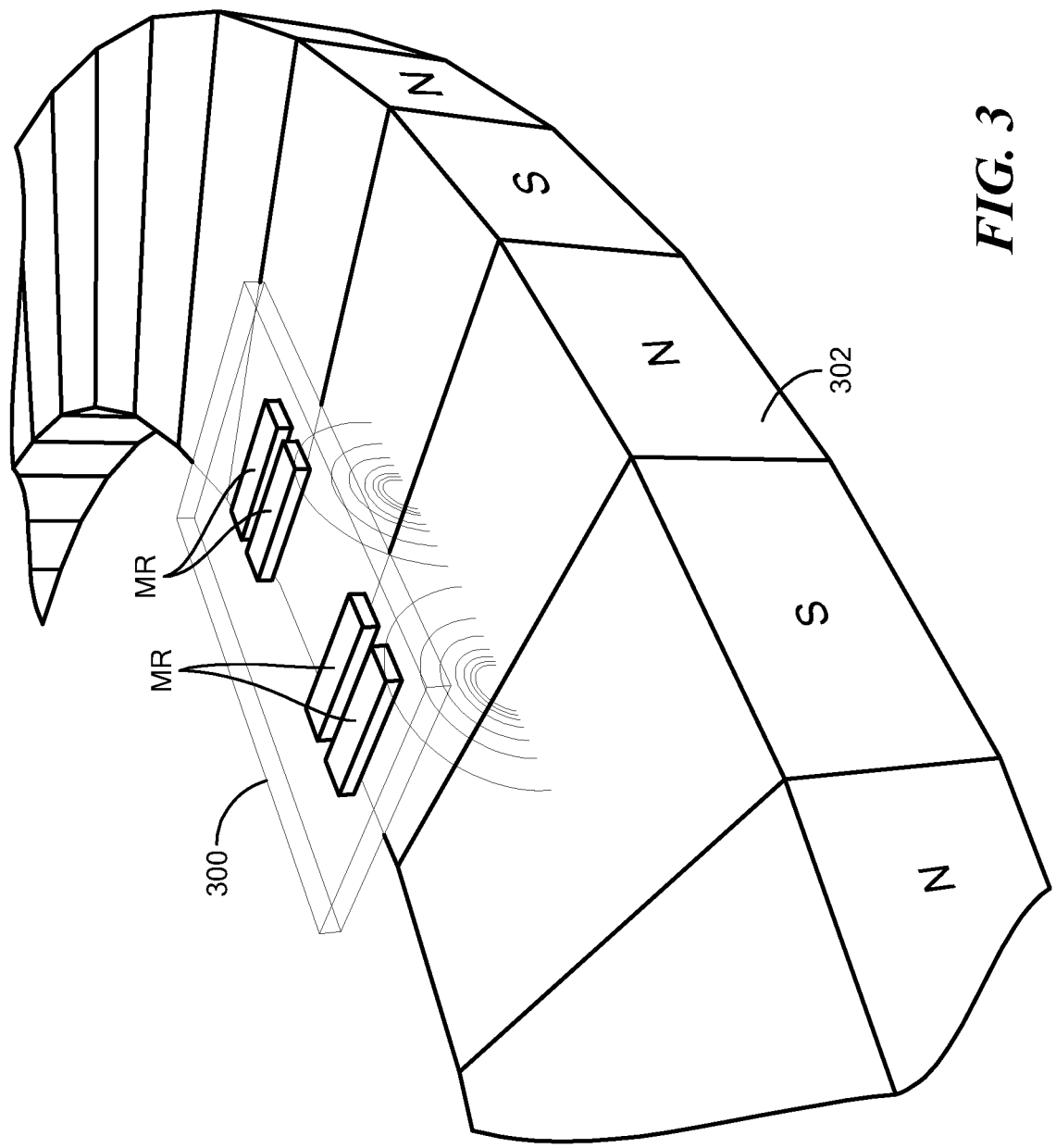
FIG. 3 shows an example MR magnetic field sensor including a magnetoresistive element having a selected magnetic orientation with a defined anisotropy of the magnetic free layer for out-of-plane sensing in accordance with example embodiments of the disclosure.

FIG. 3 shows one type of magnetic field sensor 300 that include one or more magnetoresistance elements MR having a dusting layer on a free layer. Here, four magnetoresistance elements are shown which can be of a type described above arranged over a common substrate. The four magnetoresistance elements can be arranged in a bridge. Other electronic components (not shown), for example, amplifiers and processors, can also be integrated upon the common substrate.

The magnetic field sensor 300 can be disposed proximate a moving magnetic object, for example, a ring magnet 302 having alternating north and south magnetic poles. The ring magnet 302 is subject to rotation. The magnetic field sensor 300 can be configured to generate an output signal indicative of at least a speed of rotation of the ring magnet. In some arrangements, the ring magnet 302 is coupled to a target object, for example, a cam shaft in an engine, and the sensed speed of rotation of the ring magnet 302 is indicative of a speed of rotation of the target object.

While the magnetic field sensor 300 is used as a rotation detector, it should be understood that other similar magnetic field sensors, for example, current sensors, can have one or more of the magnetoresistance elements.

As used herein, the term "anisotropy" or "anisotropic" refer to a particular axis or direction to which the magnetization of a ferromagnetic or ferrimagnetic layer tends to orientate when it does not experience an additional external field. An axial anisotropy can be created by a crystalline effect or by a shape anisotropy, both of which allow two equivalent directions of magnetic fields. A directional anisotropy can also be created in an adjacent layer, for example, by an antiferromagnetic layer, which allows only a single magnetic field direction along a specific axis in the adjacent layer.

In view of the above, it will be understood that introduction of an anisotropy in a magnetic layer results in forcing the magnetization of the magnetic layer to be aligned along that anisotropy in the absence of an external field. In the case of a GMR or TMR element, a directional anisotropy provides an ability to obtain a coherent rotation of the magnetic field in a magnetic layer in response, for example, to an external magnetic field.

In general, magnetic materials can have a variety of magnetic characteristics and can be classified by a variety of terms, including, but not limited to, ferromagnetic, antiferromagnetic, and nonmagnetic. Description of the variety of types of magnetic materials is not made herein in detail. However, let it suffice here to say, that a ferromagnetic material is one in which magnetic moments of atoms within the ferromagnetic material tend to, on average, align to be both parallel and in the same direction, resulting in a nonzero net magnetic magnetization of the ferromagnetic material.

An antiferromagnetic material is one in which magnetic moments within the antiferromagnetic material tend to, on average, align to be parallel, but in opposite directions in sub-layers within the antiferromagnetic material, resulting in a zero net magnetization.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
    forming, as part of a magnetic sensor, a free layer, wherein the free layer comprises CoFeB material;
    selecting a thickness of the CoFeB material to produce out-of-plane sensing for the sensor; and
    controlling a thickness of a dusting layer of an oxide material on the free layer to achieve perpendicular magnetic anisotropy for an interface of the oxide material and the CoFeB for providing a desired sensitivity for the sensor,
    wherein the magnetic sensor comprises an angle sensor.

2. The method according to claim 1, wherein the oxide material comprises MgO.

3. The method according to claim 1, wherein the thickness of the CoFeB material determines an orientation of a magnetic field of the free layer.

4. The method according to claim 1, wherein the perpendicular magnetic anisotropy occurs as a result of hybridization between 2p and 3d orbitals of Oxygen in the oxide material and Fe in the CoFeB.

5. The method according to claim 1, wherein a magnetic field orientation of the free layer is orthogonal to magnetic field orientations of a reference layer.

6. The method according to claim 1, wherein the CoFeB material has a thickness of less than 1.4 nm.

7. The method according to claim 1, wherein the CoFeB material has a thickness of about 1.0 nm.

8. The method according to claim 1, wherein a response of the magnetic sensor is linear.

9. A magnetic field sensor, comprising:
    a free layer comprising CoFeB material having a thickness to produce out-of-plane sensing for the sensor; and
    a dusting layer comprising an oxide material on the free layer to achieve perpendicular magnetic anisotropy for an interface of the oxide material and the CoFeB of the free layer for providing a desired sensitivity for the sensor,
    wherein the magnetic sensor comprises an angle sensor.

10. The sensor according to claim 9, wherein the oxide material comprises MgO.

11. The sensor according to claim 9, wherein the thickness of the CoFeB material determines an orientation of a magnetic field of the free layer.

12. The sensor according to claim 9, wherein the perpendicular magnetic anisotropy occurs as a result of hybridization between 2p and 3d orbitals of Oxygen in the oxide material and Fe in the CoFeB.

13. The sensor according to claim 9, wherein a magnetic field orientation of the free layer is orthogonal to magnetic field orientations of a reference layer.

14. The sensor according to claim 9, wherein the CoFeB material has a thickness of less than 1.4 nm.

15. The sensor according to claim 9, wherein the CoFeB material has a thickness of about 1.0 nm.

16. The sensor according to claim 9, wherein a response of the magnetic sensor is linear.

* * * * *